US005662815A

United States Patent [19]

Kim

[11] Patent Number: 5,662,815

[45] Date of Patent: Sep. 2, 1997

[54] FABRICATING METHOD OF A MULTIPLE MICRO-TIP FIELD EMISSION DEVICE USING SELECTIVE ETCHING OF AN ADHESION LAYER

[75] Inventor: Jong-min Kim, Seoul, Rep. of Korea

[73] Assignee: Samsung Display Devices Co., Ltd., Suwon, Rep. of Korea

[21] Appl. No.: 509,459

[22] Filed: Jul. 31, 1995

[30] Foreign Application Priority Data

Mar. 28, 1995 [KR] Rep. of Korea ........................ 95-6748

[51] Int. Cl.[6] ........................................ H01J 1/30

[52] U.S. Cl. ........................ 216/11; 216/41; 216/57; 445/50; 445/51

[58] Field of Search ........................ 216/11, 40, 41, 216/49, 51, 57, 67, 95, 100, 102, 103, 104, 108, 109; 445/50, 51; 313/309, 351

[56] References Cited

U.S. PATENT DOCUMENTS 3,998,678 12/1976 Fukase et al. .............................. 156/3
5,148,079 9/1992 Kado et al. .............................. 313/309
5,220,725 6/1993 Chan et al. .............................. 29/874
5,420,054 5/1995 Choi et al. .............................. 437/38
5,580,467 12/1996 Kim .............................. 445/50

*Primary Examiner*—Robert Kunemund
*Assistant Examiner*—Anita Alanko
*Attorney, Agent, or Firm*—Foley & Lardner

[57] ABSTRACT

A multiple micro-tip field emission device is fabricated by forming a titanium adhesion layer under a striped tungsten cathode, etching the tungsten cathode radially using an aluminum mask and selectively etching the titanium adhesion layer, so that multiple micro-tips are formed due to the intrinsic internal stress of the tungsten itself. Thereby, the adjustment of the tip size is optionally available during the process and has excellent reproducibility since the process uses the intrinsic internal stress of the tungsten and the characteristic of a buffered oxide etching (BOE) method. Also, the output current can be controlled in a wide range from nA to mA because of the multiple micro-tips. By forming the tips with tungsten, the device has good strength, oxidation characteristics and work function and has good electrical, chemical and mechanical endurance.

11 Claims, 3 Drawing Sheets

FABRICATING METHOD OF A MULTIPLE MICRO-TIP FIELD EMISSION DEVICE USING SELECTIVE ETCHING OF AN ADHESION LAYER

BACKGROUND OF THE INVENTION

The present invention relates to a method of fabricating a field emission device, and more particularly to a method of fabricating a multiple micro-tips field emission device, in which the uniformity of emitted current is improved so as to be used for a flat panel display.

Recently, flat image display devices have been actively developed as a replacement for the CRT (cathode ray tube) of conventional T.V. sets, in particular their use in wall-mounted (tapestry) television and high definition television (HDTV). Flat image display devices include liquid crystal display devices, plasma display panels and field emission devices. Among these, the field emission device is being concentrated on due to its image brightness and low power-consumption.

Referring to FIG. 1, the structure of a conventional field emission device is described.

The field emission device includes a glass substrate 1, a cathode 2 formed on glass substrate 1 in stripes, a micro-tip 4 for field-emission formed on cathode 2 in an array structure, an insulation layer 3 formed on cathode 2 to surround micro-tip 4, and a gate electrode 5 formed on insulation layer 3 in stripes perpendicular to cathode 2 and having a gate aperture 6 over micro-tip 4 for field emission.

To fabricate field emission device of the above structure, it is necessary to form a nanometer-sized micro-tip array. Therefore, fine processing of a submicron unit is required in the gate aperture etching process so that the gate having a precise aperture size, considering the micro-tip size (radius) can be formed, because, without such a fine processing, the gate aperture is too large, whereby a high driving bias voltage is required and the tip radius itself can affect uniformity of the flat panel display device. That is, the micro-tip radius must be under 200 Å, and the gap between the gate and the micro-tip must be within submicrons.

In the actual manufacturing process, nonuniformity of film thickness, nonuniformity in the micro-tip forming process and difficulty in a layer parting process remain problematic. This problem causes nonuniformity of luminance when the field emission display device is used as the flat panel display device, and nonuniformity of current emission amount when used as a very high frequency device. Particularly, since the array of a plurality of micro-tips must be fabricated uniformly in a device requiring large current emission, such as is used in a very high frequency amplifier or other electron beam-applied apparatus, a high yield cannot be obtained in the fabrication process because of the nonuniformity problem.

SUMMARY OF THE INVENTION

To solve the above problems, it is an object of the present invention to provide a method of fabricating a multiple micro-tip field emission device in which electrons can be uniformly emitted.

Accordingly, to achieve the above object, there is provided a method of fabricating a multiple micro-tip field emission device comprising the steps of: forming an adhesion layer on a substrate; forming a cathode in stripes on said adhesion layer; depositing aluminum with an electron-beam on said adhesion layer and cathode; forming a mask of a radial pattern using a lift-off method by patterning said deposited aluminum; etching radially said cathode by a reactive ion etching method using said mask to form portions where multiple micro-tips are to be formed; forming insulation layer on said adhesion layer, cathode and portions where the multiple micro-tips are to be formed; forming a gate electrode on said insulation layer in stripes across said cathode; forming an aperture by patterning said gate electrode using the lift-off method to form electron passage; forming a hole by etching said insulation layer under said aperture; and forming the multiple micro-tips by selectively etching said adhesion layer so that said portions where the multiple micro-tips are to be formed are lifted up.

In the present invention, it is preferable that titanium or aluminum is deposited to a thickness of about 200 Åin the adhesion forming step, that tungsten is formed by depositing to a thickness of about 1 μm in the cathode forming step, that $CF_4/O_2$ plasma is employed in the reactive ion etching method in the cathode etching step, that $SiO_2$ is deposited to a predetermined thickness by utilizing a PECVD method or a sputtering method to form the insulation layer, that Cr is deposited to form the gate electrode, that $SiO_2$ insulation layer is etched by a reactive ion etching method utilizing $CHF_3/O_2$ plasma in the hole forming step, and that a buffered oxide etching method (BOE) utilizing a solution in which the ratio of $HF:NH_4F$ is from 7:1 to 10:1, is employed at the multiple micro-tips forming step.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
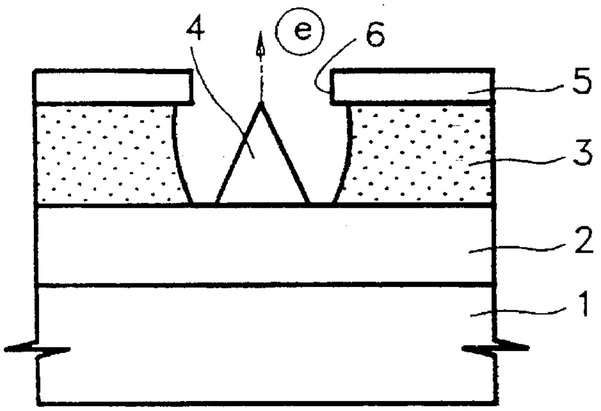
FIG. 1(PRIOR ART)
FIG. 1 is a section illustrating a conventional field emission device.
Figure 2:
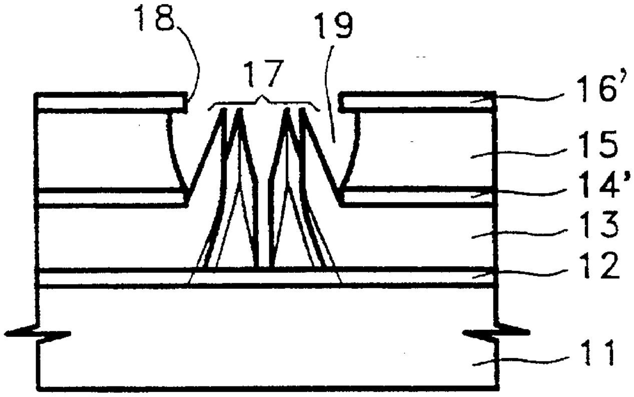
FIG. 2 is a section illustrating a multiple micro-tip field emission device according to the present invention.

Referring to FIG. 2, a multiple micro-tip field emission device according to the present invention comprises a substrate 11, an adhesion layer 12 formed on substrate 11, a cathode 13 formed on adhesion layer 12 in stripes, multiple micro-tips 17 formed by etching a predetermined part of cathode 13 in an array form such that the etched part is radially lifted up, an insulation layer 15 formed to surround the multiple micro-tips 17, and a gate electrode layer 16' formed on insulation layer 15 having an aperture for field-emission from the multiple micro-tips. Here, mask 14' is for the fabrication of the micro-tips.

Figure 3A:
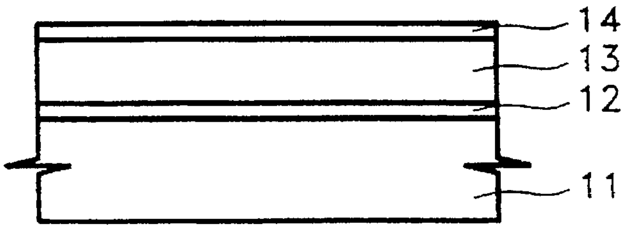
FIGS. 3A to 3H are sections illustrating the fabrication sequence of the multiple micro-tip field emission device according to the present invention.
Figure 3B:
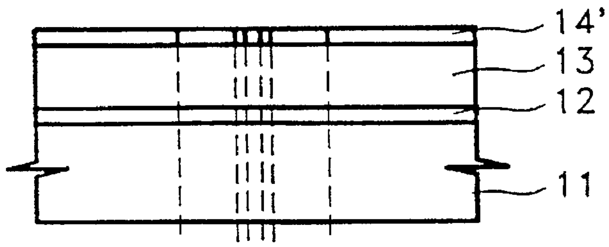
Figure 3C:
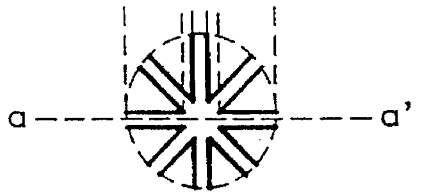

Referring to FIGS. 3A to 3H, the fabricating process of the multiple micro-tip field emission device having the above structure, is described hereinafter FIG. 3C is a plan view of the aluminum mask.

As shown in FIG. 3A, a titanium adhesion layer 12 with a thickness of about 2000 Åis deposited on substrate 11. Then, tungsten is deposited to a thickness of about 1 μm and cathode 13 is formed by etching the deposited tungsten layer. Aluminum is then deposited using an electron-beam so as to form an aluminum layer 14.

Referring to FIG. 3B, a 9 mask 14' for forming multiple micro-tips is formed by etching the aluminum layer 14 by photolithography. Mask 14' is etched radially to form the shape shown in FIG. 3C. Alternatively, mask 14' may be formed using a lift-off method. Here, FIG. 3B is a section taken along the line a–a' in FIG. 3C.

Figure 3D:
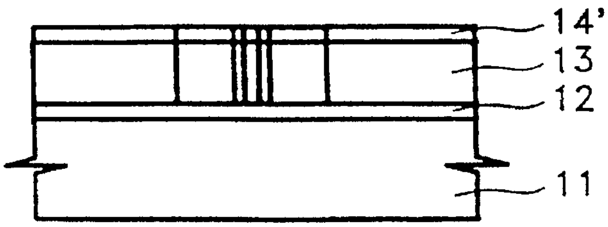

Next, as shown in FIG. 3D, a tungsten cathode 13 is radially etched using aluminum mask 14', by an RIE (reactive ion etching) method using $CF_4/O_2$ plasma, to form triangular parts corresponding to the multiple micro-tips.

Figure 3E:
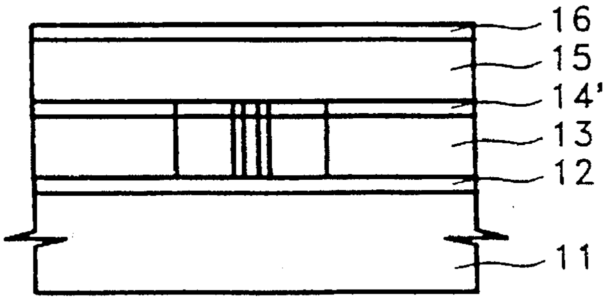

In FIG. 3E, an insulation layer 15 is deposited using $SiO_2$ to a thickness of about 1 μm on the substrate on which aluminum mask 14' is formed. Then, a gate electrode layer 16 is formed by depositing Cr onto the $SiO_2$ layer and gate electrodes 16' are formed by etching the Cr layer in stripes perpendicular to cathode 13. The gates 16' may be formed using the lift-off method.

Figure 3F:
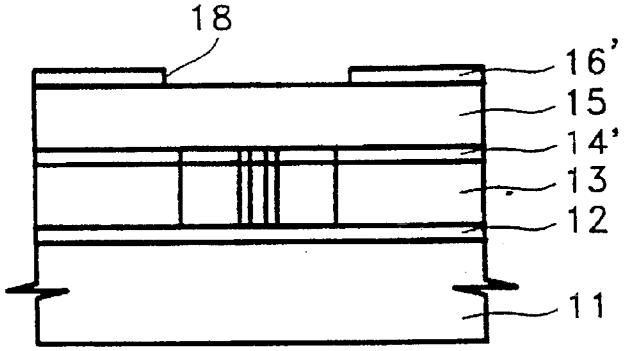

In FIG. 3F, an aperture 18 is formed in Cr gate 16' for passing electrons therethrough.

Figure 3G:
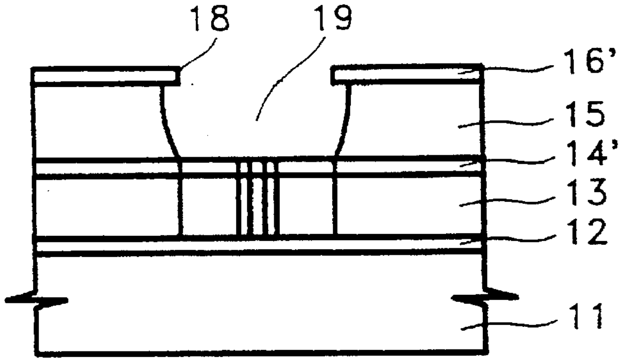

In FIG. 3G, a hole 19 is formed by etching insulation layer 15 through aperture 18 of gate 16' using the RIE method.

Figure 3H:
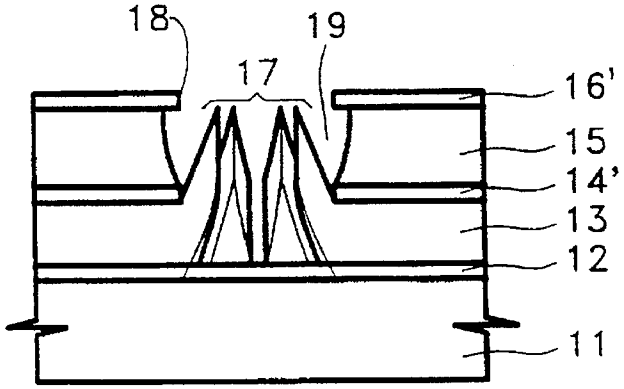

In FIG. 3H, the multiple micro-tips are formed by selectively etching the titanium adhesion layer 12 using a BOE (buffer oxide etching) method to complete the device. At this time, the etching rate (etching speed) of titanium adhesion layer 12 is very fast in order to etch in a short time, so that multiple triangular shaped micro-tips are lifted up from the tungsten cathode due to its internal stress. In the above process, it is important to control the etching speed precisely since the etching speed is very fast.

In the BOE method, the etching solution used has a ratio of HF to $NH_4F$ from 7:1 to 10:1.

The geometrical feature of the multiple tungsten micro-tips is determined by the intrinsic stress of the tungsten cathode layer.

In a completed field emission device of the above construction, when voltage of between 10 to 100 V is applied with a vacuum of $10^{-6}$ to $10^{-7}$ Torr and a positive gate voltage, and a negative or grounded cathode voltage, electrons are emitted from the micro-tips by a strong electrical field. Here, the electron emission degree is controlled by the number of micro-tips according to the tungsten pattern and the distance between the gate electrode and the tip end. Since high-current emission is possible in a single gate aperture pattern with the multiple micro-tips, the device can be used as a flat panel display device, a high-output microwave device, an electron-beam applied a scanning electron microscopy (SEM), an electron-beam applied system device or a pressure sensor using multiple beam emission.

As described above, the multiple micro-tip field emission device is fabricated by forming the titanium adhesion layer onto which the tungsten cathode is formed in stripes, and etching the tungsten cathode radially and selectively etching the titanium adhesion layer so that the multiple micro-tips are formed due to the intrinsic internal stress of the tungsten cathode. Therefore, in the method of fabricating the multiple micro-tip field emission device according to the present invention, the tip size can be optionally adjusted in the process. Also, the output current can be controlled in a wide range from nA to mA of the multiple micro-tips. Further, by forming the multiple micro-tips using tungsten, the device has a better strength, oxidation characteristics and work function and has good electrical, chemical and mechanical endurance.

What is claimed is:

1. A method of fabricating a field emission device having multiple micro-tips comprising the steps of:

a) forming an adhesion layer on a substrate;

b) forming a cathode having a striped pattern on said adhesion layer;

c) depositing aluminum with an electron-beam on said adhesion layer and said cathode;

d) forming a mask of a radial pattern using a lift-off method by patterning said deposited aluminum;

e) etching radially said cathode by a reactive ion etching method using said mask to form portions where multiple micro-tips are to be formed;

f) forming an insulation layer on said adhesion layer, said cathode and said portions where the multiple micro-tips are to be formed;

g) forming a gate electrode on said insulation layer having a stripe pattern perpendicular to the striped pattern of said cathode;

h) patterning said gate electrode using the lift-off method to form an aperture for electron passage;

i) etching said insulation layer under said aperture to form a hole therein; and j) forming the multiple micro-tips by selectively etching said adhesion layer so that said portions where the multiple micro-tips are to be formed are lifted up.

2. A method of fabricating a field emission device as claimed in claim 1, wherein titanium or aluminum is deposited to form said adhesion layer in said step a).

3. A method of fabricating a field emission device as claimed in claim 1, wherein tungsten is deposited to form said cathode in said step b).

4. A method of fabricating a field emission device as claimed in claim 1, wherein photolithography is employed to form said mask in said step d).

5. A method of fabricating a field emission device as claimed in claim 1, wherein $CF_4/O_2$ plasma is employed in said step e).

6. A method of fabricating a field emission device as claimed in claim 1, wherein $SiO_2$ is deposited by utilizing a PECVD method or a sputtering method to form said insulation layer in said step f).

7. A method of fabricating a field emission device as claimed in claim 1, wherein Cr is deposited to form said gate electrode in said step g).

8. A method of fabricating a field emission device as claimed in claim 1, wherein said insulation layer is etched by the reactive ion etching method utilizing $CHF_3/O_2$ plasma to form said hole in said step i).

9. A method of fabricating a field emission device as claimed in claim 6, wherein said insulation layer is etched by the reactive ion etching method utilizing $CHF_3/O_2$ plasma to form said hole in said step i).

10. A method of fabricating a field emission device as claimed in claim 1, wherein a buffered oxide etching method (BOE) is employed to etch said adhesion layer in said step j).

11. A method of fabricating a field emission device as claimed in claim 10, wherein a solution in which the ratio of $HF:NH_4F$ is from 7:1 to 10:1, is used for said buffered oxide etching method.

* * * * *